United States Patent [19]

Mutz

[11] Patent Number: 5,130,676

[45] Date of Patent: Jul. 14, 1992

[54] PHASE LOCKED LOOP FREQUENCY SYNTHESIZER WITH DC DATA MODULATION CAPABILITY

[75] Inventor: Leslie D. Mutz, Hoffman Estates, Ill.

[73] Assignee: Motorola, Inc., Schaumburg, Ill.

[21] Appl. No.: 760,028

[22] Filed: Sep. 6, 1991

[51] Int. Cl.$^5$ .............................................. H03C 3/00
[52] U.S. Cl. .................................. 332/100; 332/127; 331/23; 375/45; 375/62
[58] Field of Search ............... 332/100, 101, 127, 128; 331/23, 25; 375/45, 48, 62, 65

[56] References Cited

U.S. PATENT DOCUMENTS

| | | |
|---|---|---|
| 4,471,328 | 9/1984 | Chapman . |
| 4,581,749 | 4/1986 | Carney et al. .................. 332/100 X |
| 4,755,774 | 7/1988 | Heck . |

*Primary Examiner*—Robert J. Pascal
*Attorney, Agent, or Firm*—Donald B. Southard; Anthony J. Sarli; Steven G. Parmelee

[57] ABSTRACT

A phase locked loop frequency synthesizer with DC data modulation capability is described. This synthesizer includes an arrangement for detecting one of a plurality of FSK data levels (61), generating a corresponding predetermined compensation signal (71) and utilizing the compensation signal to substantially continuously compensate the frequency synthesizer for normal response to the detected data modulation level.

33 Claims, 2 Drawing Sheets

PHASE LOCKED LOOP FREQUENCY SYNTHESIZER WITH DC DATA MODULATION CAPABILITY

BACKGROUND OF THE INVENTION

The present invention relates generally to Phase locked loop frequency synthesizers and more particlarly to moduolation and compensation of such phase locked loop frequency synthesizer arrangements.

Modern-day communications systems, because of the larger number of users relying more extensively on wireless communications of all forms in conjunction with a largely fixed amount of radio spectrum, have been forced to evolve toward more spectrum efficient formats. Trunked systems, such as cellular telephone, and other centrally managed systems, with large numbers of radio frequency carriers are now the norm. In addition, utilization of digital data with greater modulation format complexity continues to increase. Thus, communications equipment for these systems must economically generate a large number of high stability radio frequency carriers and these carriers need extensive, flexible modulation capability.

Phase locked loop techiques are well known approaches to generating any one of the large number of radio frequency carriers required by todays communications systems. These techniques generally involve the application of control theory and utilize a feedback arrangement of some sort to lock a voltage controlled oscillator's frequency to a reference oscillator's frequency. The voltage controlled oscillator output then has the same inherent frequency stability as the reference oscillator at a fraction of the cost of a large number of high stability oscillators.

However, simply providing a radio frequency carrier is not enough. That carrier must convey some information. This is often accomplished by modulating the frequency of the carrier in accordance with the informotion or modulation signal. Therein lies a significant problem practitioners in the art must solve in one way or another. Generally the phase locked loop frequency synthesizer is designed such that its normal response to an external influence, such as modulation, is an attempt to hold the output carrier frequency invariant. Yet, to be useful, the carrier frequency must not only vary, but vary in proportion to, or largely in proportion to, a modulating signal.

Various solutions to the modulation problem have been proposed or used at one time or another. All such arrangements, however, suffer from either performance limitations (in terms of frequency response) or excessive cost, complexity or current drain. One reasonably successful approach, as disclosed in U.S. Pat. 4,775,774 to Heck, suffers because it may not proviide faithful modulation capability for non-zero average (DC) modulation or for modulation formats which include a DC component such as non-return to zero (NRZ) frequency shift keyed modulation. This places an excessive burden on the system disigner in that only modulation signals with an average value of zero can be efficiently utilized since the disclosed phase locked loop may not fully reproduce the DC component. This could prove to be a particularly significant problem at low data rate signalling or where the number of signalling levels may be significantly greater than two because the DC component of these signals may be comparatively large.

Another technique used in some prior communications systems, does provide an acceptable degree of faithful response to a non-zero average value, two-level, NRZ frequency shift keyed modulation signal. This approach consists of processing the two-level data modulation to assess its average value which is then used to adjust (i.e. by adding or subtracting pulses) the frequency of the pulse trains governing phased locked loop operation. However, this technique may well be considered excessively complex as well as costly and the operating frequencies of some of the elements may necessarily imply greater current drains. In addition, the economic burdens of extending this technique, if possible at all, to four, eight or more level frequency shift keying undeniably detract from its applicability.

Therefore, it will be appreciated that a need exists for an improved phase locked loop frequency synthesizer that is capable of being modulated by two or more level data signals where the average (DC) value of the data is non zero.

SUMMARY OF THE INVENTION

This invention solves the aforementioned needs by providing a phase locked loop frequency synthesizer adapted for continuous multi-level frequency shift keyed modulation capability fully compensated for any undesired DC offset. The adaptation includes detecting any one of a plurality of frequency shift keyed modulation levels and providing a detected modulation level indication. In response to this detected modulation level, a corresponding predefined (predicted) compensation signal is generated and utilized to substantially compensate, on a continual basis, for the otherwise normal response of the phase locked loop frequency synthesizer.

BRIEF DESCRIPTION OF THE DRAWINGS

The features of the present invention which are believed to be novel are set forth with particularity in the appended claims. The invention, itself, however together with further advantages thereof, may best be understood by reference to the accompanying drawings in which:

DETAILED DESCRIPTION

Figure 1:
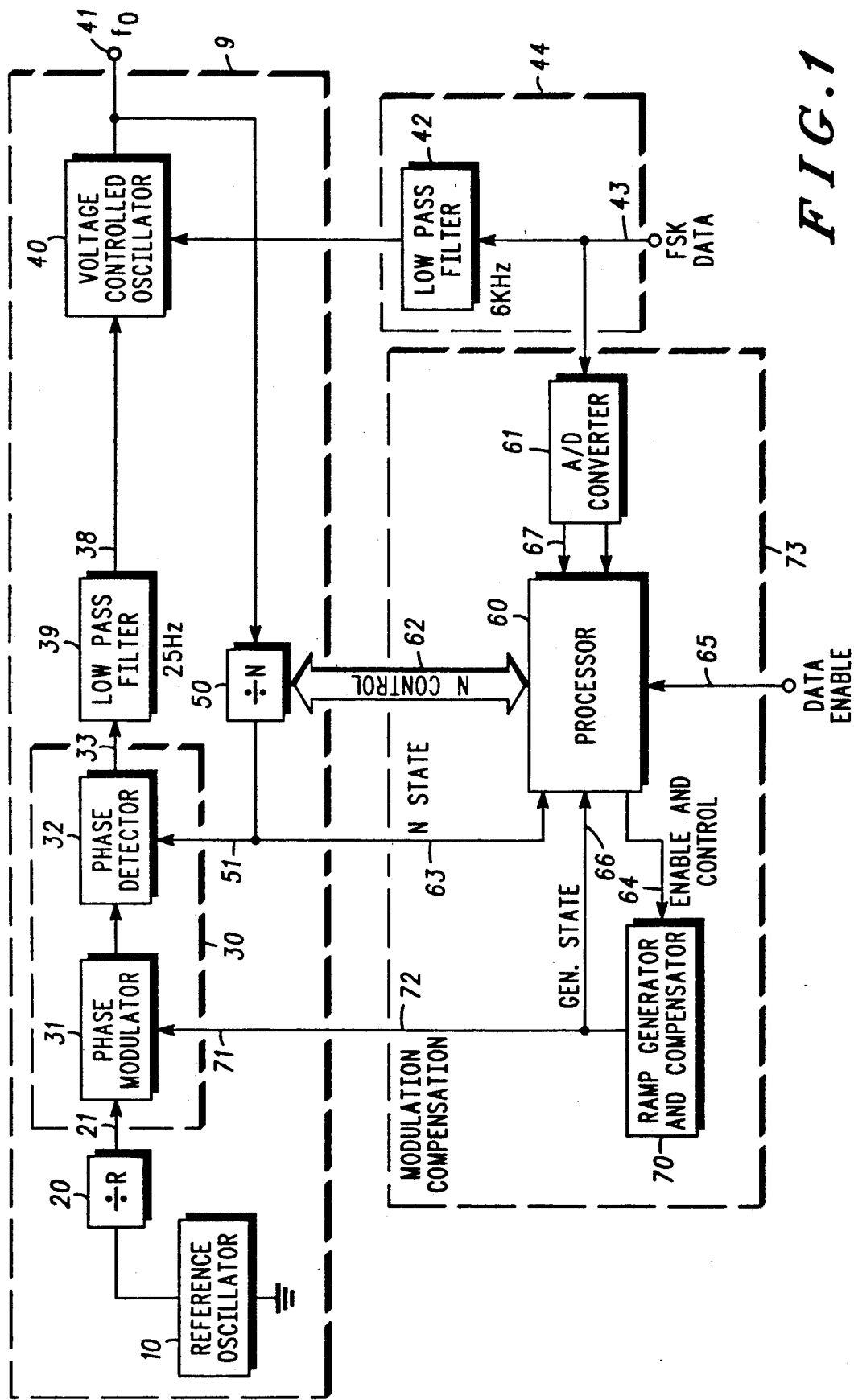
FIG. 1 is a block diagram of a phase locked loop frequency synthesizer adapted for frequency shift keyed modulation in accordance with one embodiment of the present invention.
Figure 2:
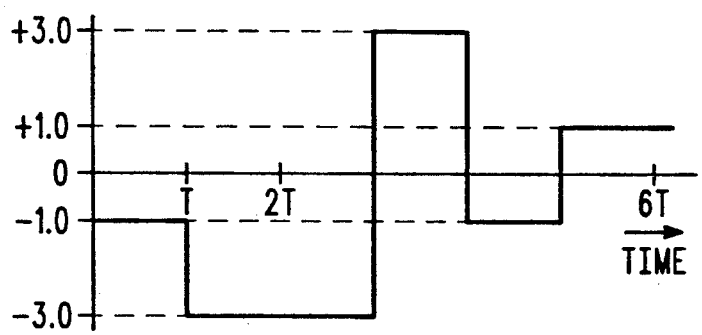
FIG. 2 is a diagram of a four level non-return to zero (NRZ) frequency shift keyed (FSK) signal.

Referring now to the drawings, a phase locked loop frequency synthesizer device is depicted in FIG. 1 as represented by the dashed box 9. Briefly, it incluses a reference signal portion comprised of reference oscillator (10) coupled to a divide-by-R (20) for generating a reference signal (21). Typically the reference oscillator is a precision frequency, crystal oscillator and the divide-by-R operates to divide the reference oscillator frequency down to a desired reference signal frequency, such as 5 KHz. The remainder of the block diagram within dashed box (9) is a phase locked loop arrangement for receiving the reference signal (21) and generating an output oscillator signal (41). The functional elements of the phase locked loop include a phase detector (32), loop filter (39), voltage controlled oscillator (40) and a programmable loop divider (50), all arranged and intercoupled in appropriate phase locked loop fashion, as depicted, and operating to generate the output oscillator signal (41) whose frequency, in the absence of modulation such as referenced in FIG. 2, is N/R × the reference oscillator frequency.

The balance of FIG. 1 includes a modulation source (44) and a signal compensation section (73). The modulation source (44), comprised of frequency shift keyed (FSK) data signal (43) coupled to the voltage controlled oscillator (40) thru a low pass filter (42), provides a multi-level (2 or more) FSK modulation signal, such as specifically portrayed by FIG. 2. The compensation section (73), responsive to the modulation signal, and which includes A to D converter (61), processor (60) and ramp generator/compensator (70) interconnected as shown, develops a corresponding predefined, and thus predicted, compensation signal (72). This compensation signal (72), appropriately utilized will compensate for (substantially cancel) the normal response of the phase locked loop when the modulation signal is coupled to the voltage controlled oscillator (40) and thereby allow FSK modulation at arbitrarily low symbol rates or arbitrarily large non-zero average data signal values.

The compensation section (73) is functionally comprised of a detector arrangement for providing a detected modulation level corresponding to one of a plurality of FSK modulation levels, and a signal synthesis circuit responsive to the detected modulation level for synthesizing a corresponding predefined compensation signal (72). The detector arrangement, comprised in FIG. 1 of A to D converter (61) intercoupled to processor (60) operates on the FSK modulation signal (43) to provide a 2 bit input (67) to processor (60). The processor (60) looks for a "data enable" (65) and in response provides a detected modulation level which corresponds to the input (67). Those skille in the art will appreciate that the input (67) must vary according to how many FSK levels are possible. For example, a binary (two input state) digital signal is sufficient for 2 level FSK and 8 input states (for example 3 parallel lines) are required for 8 level FSK.

The signal synthesis portion of compensation section (73) is functionally comprised of a control function (i.e., part of processor 60), responsive to the detected modulation level, for providing a programmable loop divider control signal (62) and a corresponding compensation control signal (64), and a generator circuit (70), responsive to the corresponding compensation control signal (64), for generating the corresponding predefined compensation signal (72). The control function, embodied in processor (60), is coupled to the programmable loop divider (50) at (62) and (63). By setting the programmable loop divider divisor N to a specific value the proessor (60), determines the nominal frequency of the output oscillator signal (41). The generator circuit, ramp generator/compensator (70), in its simplest embodiment is a ramp generator. This ramp generator has a settable slope and may be enabled or disabled all responsive to the control function, processsor (60), via (64).

The control function (part of processor 60) may also be viewed as further comprising a threshold arrangement (also part of processor 60) for changing the divisor N of the programmable loop divider (50) in response to the corresponding predefined compensation signal (72) satisfying a threshold condition. In FIG. 1 processor (60) monitors the corresponding predefined compensation signal (72) at (66) and, when a threshold condition is satisfied, operates to change the divisor N of the programmable loop divider (50) by an integer, e.g., +or −one, depending on the present status, and as discussed in further detail herein below. Processor (60) now monitors the output (divided loop signal) of the programmable loop divider (50) at (63) and thereby synchronously controls at (64) the ramp generator/compensator (70) by, for example, changing a positive going ramp of slope x to a negative going ramp of slope y.

One final but certainly significant aspect of the embodiment shown in FIG. 1 is the utilization circuitry (30 and 50) arranged and constructed such that the corresponding predefined compensation signal (72) will substantially continuously compensate for normal response of the frequency synthesizer to the detected modulation level. This utilization circuit includes the programmable loop livider (50) and a cancellation circuit, depicted in dashed box (30), for cancelling the normal loop error signal at (33). The cancellation circuit (30) or alternatively FIG. 3 (30') or FIG. 4 (30'') is coupled to the reference signal (21), compensation function (73), programmable loop divider (50) and the loop filter (39).

As an illustrative example of the operation of the present invention (see FIG. 1), consider the application of a +1.0 (corresponding for example to +1 KHz) NRZ FSK modulation signal (see FIG. 2) to the voltage controlled oscillator (40) by the modulation source (44). This +1.0 level modulation signal will cause the voltage controlled oscillator to shift its output oscillator signal frequency, by the example +1 Khz. This frequency when applied to programmable loop divider (50) will generate a divided loop signal (51) with outpur pulese available to processor (60) at (63), earlier in time than during unmodulated conditions. The earlier ("phase advanced") pulse applied to phase detector (32), in the absence of the offsetting effects of the compensation function (73), described below, would cause the loop error signal (33) to decrease. This decrease ultimately (timing depends on loop dynamics) has the undesired result of driving the voltage controlled oscillator (40) back to its original unmodulated frequency.

The compensation function (73) operates to eliminate this effect. The +b 1.0 level modulation signal is simultaneously available to the analog of digital convertor (61) causing it to generate a 1,0 pattern at (67) corresponding to a positive sign bit (1) and a first level bit (0). This 1,0 input to processor (60) in conjunction with a data enable signal at (65) causes processor (60) to generate a detected modulation level corresponding to +1.0. Processor (60), acting as the control function will now provide corresponding predetermined control parameters at (64), such as gain (magnitude of slope) to the ramp generator/compensator (70) and then an enable signal synchronized to the divided loop signal (63). This enable signal causes the ramp generator/compensator (70) to generate a corresponding predetermine compensation signal (72), for example a positive going ramp signal that applied at (71) to phase modulator (31) advances the reference signal phase so as to compensate (substantially cancel) the effects of the "phase advanced" output pulse at (51). This compensation (cancellation) effect results in the output of the phase detector (32), the loop error signal (33), remaining substantially constant and thus, the voltage controlled oscillator (40) remaining at the desired modulated output oscillator frequency. This compensation (cancellation) effect will continue until the ramp generator/compensator exceeds a maximum output value.

To avoid exceeding the maximum output value, processor (60) senses the ramp generator/compensator (70) output state at (66) and when an upper threshold is satisfied, increments, by one for example, the divisor N of programmable loop divider (50). This increase in the divisor N will delay the divided loop signal (51) output pulse of the programmable loop divider (50). The processor (60), sensing the output pulse at (63) changes the ramp generator/compensator (70) to a negative going ramp with predetermined characteristics, such as slope, sufficient to retard the phase of the reference signal (21) such that the loop error signal (33) output of the phase detector (32) remains substantially unchanged. This continues until the ramp generator/compensator (70) output satisfies a lower threshold at which point the processor (60) decrements the divisor N and synchronously reverses the direction of the ramp generator/compensator output and the cycle thereafter continuously repeats. The above process results in substantially continuously compensating for normal response of the frequency synthesizer to the detected modulation level.

Figure 3:
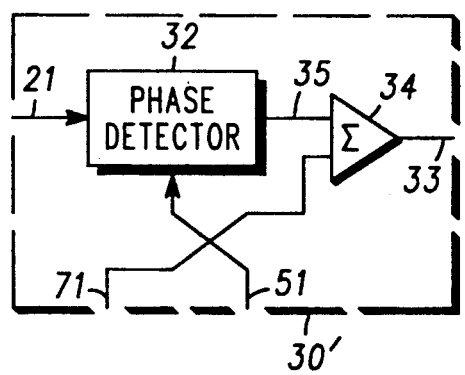
FIG. 3. is a block diagram of a portion of the phase locked loop frequency synthesizer of FIG. 1 which effectively constitutes a second embodiment of the present invention.
Figure 4:
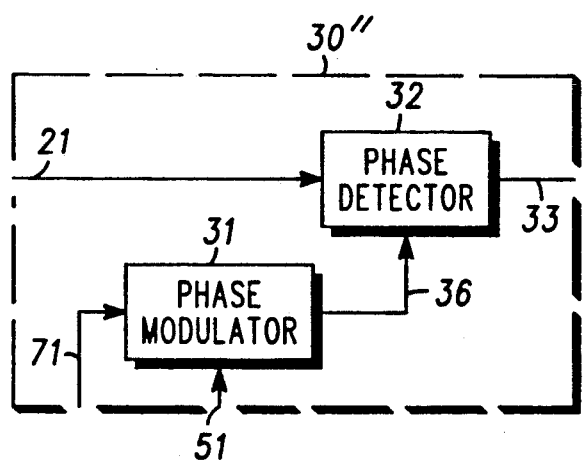
FIG. 4. is a block diagram of a portion of the phase locked loop frequency synthesizer of FIG. 1 constituting a still further embodiment thereof.

Alternative embodiments of the cancellation circuit are shown in FIG. 3 and FIG. 4. Conceptually, the invention described above does not change, however specific predefined parameters, polarities, specific threshold levels and possibly specific waveshapes may change with these or other alternative embodiments. For example, consider the operation of the FIG. 3 embodiment under the modulation conditions outlined above. The voltage controlled oscillator (40) frequency will increase resulting in a phase advanced divided loop signal output pulse (51) from the programmable loop divider (50). This phase advanced output pulse (51), when compared to the reference signal (21) by phase detector (32), results in a decreasing phase detector output (35). The compensation function (73) operating in a fashion similar to the above description generates a corresponding predefined compensation signal (72) available at (71). The decreasing phase detector output (35) and the corresponding predefined compensation signal (71) are combined by a summer (34) to yield a substantially constant loop error signal output (33), which allows the voltage controlled oscillator (40) to continue operating at the desired modulated frequency. In the FIG. 3 embodiment the predetermined parameters supplied by processor (60) to ramp generator/compensator (70) must consider at least the effect of the phase detector (32) gain in addition to the issues considered in the FIG. 1 embodiment.

Finally, and by way of illustrative example only, we may turn to the operation of FIG. 4 under the modulation conditions as outlined above. As will be appreciated, the voltage controlled oscillator (40) frequency will increase resulting in a phase advanced divided loop signal output pulse (51) from the programmable loop divider (50). This phase advanced output pulse (51), is then coupled to a phase modulator (31) where the output pulse phase is in turn retarded in accordance with a corresponding predetermined compensation signal (72) available at (71) supplied by the compensation function (73) operating in a fashion similar to the above description. This results in a substantially constant loop phase input (36) to phase detector (32) and hence a substantially constant loop error signal output (33) which allows the voltage controlled oscillator (40) to continue operating on the desired modulated frequency. Note that the polarity, among other parameters, of the compensation signal required by the FIG. 4 embodiment may differ from the FIG. 1 embodiment. Other operational features of the compensation function (73), when used with the FIG. 3 or FIG. 4 embodiments, are the same or similar to the description provided above in conjunction with the FIG. 1 embodiment.

Accordingly, what is claimed is:

1. A phase locked loop frequency synthesizer adapted for continuous multi-level frequency shift keyed modulation capability comprising:
   detector means for detecting any one of a plurality of frequency shift keyed modulation levels, for providing a detected modulation level;
   signal synthesis means, responsive to said detected modulation level, for synthesizing a corresponding predefined compensation signal; and
   utilization means for ultilizing said corresponding predefined compensation signal, arranged and constructed such that said corresponding predefined compensation signal substantially continuously compensates, on a fully predicted basis, for normal response of the frequency synthesizer to said detected modulation level.

2. A phase locked loop frequency synthesizer in accordance with claim 1 wherein said detector means includes an analog to digital convertor.

3. A phase locked loop frequency synthesizer in accordance with claim 1 wherein said detector means includes a processor.

4. A phase locked loop frequency synthesizer in accordance with claim 1 wherein said signal synthesis means includes a control means, responsive to said detected modulation level, for providing a corresponding compensation control signal.

5. A phase locked loop frequency synthesizer in accordance with claim 4 wherein said signal synthesis means further includes a generating means, responsive to said corresponding compensation control signal for generating a corresponding predefined compensation signal.

6. A phase locked loop frequency synthesizer in accordance with claim 4 wherein said control means, includes a processor.

7. A phase locked loop frequency synthesizer in accordance with claim 4 wherein said corresponding compensation control signal includes a corresponding predetermined control parameter and an enable signal.

8. A phase locked loop frequency synthesizer in accordance with claim 1 wherein said signal synthesis means includes a threshold means for detecting when said corresponding predefined compensation signal satisfies a threshold condition.

9. A phase locked loop frequency synthesizer in accordance with claim 1 wherein said utilization means includes a programmable loop divider for producing a divided loop signal, a reference signal and phase detector means, coupled to said divided loop signal and said reference signal, for generating a phase detector output signal.

10. A phase locked loop frequency synthesizer in accordance with claim 9 wherein said utilization means further includes a cancellation means, coupled to said signal synthesis means, for phase shifting said reference signal such that said corresponding predefined compensation signal substantially continuously compensates for normal response of said frequency synthesizer to said detected modulation level.

11. A phase locked loop frequency synthesizer in accordance with claim 9 wherein said utilization means further includes a cancellation means, coupled to said signal synthesis means, for phase shifting said divided loop signal such that said corresponding predefined compensation signal substantially continuously compensates for normal response of said frequency synthesizer to said detected modulation level.

12. A phase locked loop frequency synthesizer in accordance with claim 9 wherein said utilization means further includes a cancellation means, coupled to said signal synthesis means, for combining said phase detector output signal and said corresponding predefined compensation signal such that said corresponding predefined compensation signal substantially continuously compensates for normal response of said frequency synthesizer to said detected modulation level.

13. A phase locked loop frequency synthesizer adapted for continuous multi-level frequency shift keyed modulation capability comprising:
   reference means for generating a reference signal;
   phase locked loop means, including a phase detector, loop filter, voltage controlled oscillator and programmable loop divider all arranged and intercoupled in phase locked loop fashion, for receiving said reference signal and for generating an output oscillator signal in response thereto;
   modulation means, coupled to said voltage controlled oscillator, for providing an at least two level frequency shift keyed modulation signal; and
   compensation means, responsive to said modulation signal, for developing an at least one corresponding predefined compensation signal coupled to said phase locked loop so as to substantially continuously compensate for normal response of said phase locked loop to said modulation signal, said compensation means further including a threshold means, coupled to said programmable loop divider, for changing a divisor of said programmable loop divider when said corresponding predefined compensation signal satisfies a threshold condition.

14. A phase locked loop frequency synthesizer in accordance with claim 13 further comprising a cancellation means, responsive to said corresponding predefined compensation signal and coupled to said phase locked loop means, for substantially continuously compensating for normal response of said phase locked loop to said modulation signal.

15. A phase locked loop frequency synthesizer in accordance with claim 14 wherein said compensation means includes a detector means, responsive to said modulation signal, for detecting at least one level of said at least two level frequency shift keyed modulation signal and providing a detected modulation level.

16. A phase locked loop frequency synthesizer in accordance with claim 15 wherein said compensation means includes a signal synthesis means, responsive to said detected modulation level, for synthesizing said corresponding predefined compensation signal.

17. A phase locked loop frequency synthesizer in accordance with claim 16 wherein said signal synthesis means includes a control means, responsive to said detected modulation level, for providing a corresponding compensation control signal.

18. A phase locked loop frequency synthesizer in accordance with claim 17 wherein said signal synthesis means further includes a generating means, responsive to said corresponding compensation control signal for generating a corresponding predefined compensation signal.

19. A phase locked loop frequency synthesizer with a voltage controlled oscillator, low pass filter, programmable loop divider, phase detector and reference signal path, adapted for continuous multi-level frequency shift keyed modulation comprising:
   detector means for detecting any one of a plurality of frequency shift keyed modulation levels to provide a detected modulation level;
   control means, responsive to said detected modulation level, for providing a programmable loop divider control signal coupled to said programmable loop divider and for providing a corresponding compensation control signal;
   generator means, responsive to said corresponding compensation control signal, for generating at least one corresponding predefined compensation signal; and
   cancellation means, coupled to said generator means and arranged and coupled to said phase locked loop frequency synthesizer, for utilizing said at least one corresponding predefined compensation signal so as to substantially continuously compensate for normal response of said frequency synthesizer to said detected modulation level.

20. A phase locked loop frequency synthesizer in accordance with claim 19 wherein said cancellation means operates to phase shift a reference signal so as to substantially continuously compensate for normal response of said frequency synthesizer to said detected modulation level.

21. A phase locked loop frequency synthesizer in accordance with claim 19 wherein said cancellation means operates to phase shift a divided loop signal so as to substantially continuously compensate for normal response of said frequency synthesizer to said detected modulation level.

22. A phase locked loop frequency synthesizer in accordance with claim 19 wherein said cancellation means operates to combine a phase detector output signal and said at least one corresponding predefined compensation signal so as to substantially continuously compensate for normal response to said frequency synthesizer to said detected modulation level.

23. In a phase locked loop frequency synthesizer a method for providing continuous multi-level frequency shift keyed modulation capability comprising the steps of:
   detecting any one of a plurality of frequency shift keyed modulation levels, thereby providing a detected modulation level;
   synthesizing, in response to said detected modulation level, a corresponding, predefined compensation signal; and
   utilizing said corresponding predefined compensation signal to substantially continuously compensate for normal response of the frequency synthesizer to said detected modulation level.

24. A method in accordance with claim 23 wherein said detecting step includes the step of converting said one of a plurality of frequency shift keyed modulation levels to a digital signal.

25. A method in accordance with claim 24 wherein said detecting step further includes the step of detecting a data enable signal.

26. A method in accordance with claim 23 wherein said synthesizing step includes the step of providing a corresponding compensation control signal.

27. A method in accordance with claim 26 wherein said synthesizing step further includes the step of generating, in response to said corresponding compensation control signal, said corresponding predefined compensation signal.

28. A method in accordance with claim 27 wherein said synthesizing step further includes the step of detecting when said corresponding predefined compensation signal satisfies a threshold condition.

29. A method in accordance with claim 23 wherein said utilizing step includes the step of phase shifting, in response to said corresponding predefined compensation signal, a reference signal.

30. A method in accordance with claim 23 wherein said utilizing step includes the step of phase shifting, in response to said corresponding predefined compensation signal, a divided loop signal.

31. A method in accordance with claim 23 wherein said utilizing step includes the step of combining a phase detector output signal and said corresponding predefined compensation signal.

32. In a phase locked loop frequency synthesizer a method for providing continuous multi-level frequency shift keyed modulation capability comprising the steps of:
   generating a reference signal;
   using a phase detector, loop filter, voltage controlled oscillator and programmable loop divider all arranged and constructed in a phase locked loop fashion, for generating an oscillator signal;
   providing an at least two level frequency shift keyed modulation signal;
   generating, in response to said at least two level frequency shift keyed modulation signal, an at least one corresponding predefined compensation signal which is coupled to said phase locked loop so as to substantially continuously compensate for normal response of said phase locked loop to said at least two level frequency shift keyed modulation signal; and
   changing a divisor of said programmable loop divider when said corresponding predefined compensation signal satisfies a threshold condition.

33. In a phase locked loop frequency synthesizer with a voltage controlled oscillator, loop filter, programmable loop divider, phase detector and reference signal path, a method for providing continuous multi-level frequency shift keyed modulation comprising the steps of:
   detecting any one of a plurality of frequency shift keyed modulation levels to provide a detected modulation level;
   providing, in response to said detected modulation level, a corresponding compensation control signal, and a programmable loop divider control signal coupled to said programmable loop divider;
   generating, in response to said corresponding compensation control signal, at least one corresponding predefined compensation signal;
   utilizing said corresponding predefined compensation signal for phase shifting a phase detector input signal so as to substantially continuously compensate for normal response of said frequency synthesizer to said detected modulation level;
   determining when said corresponding predefined compensation signal satisfies a threshold condition; and
   changing, responsive to said determining step, a divisor of said programmable loop divider.

* * * * *